(12) United States Patent
Chiu et al.

(10) Patent No.: US 10,566,498 B2
(45) Date of Patent: Feb. 18, 2020

(54) SEMICONDUCTOR LIGHT-EMITTING DEVICE

(71) Applicant: EPISTAR CORPORATION, Hsinchu (TW)

(72) Inventors: Hsin-Chih Chiu, Hsinchu (TW); Shih-I Chen, Hsinchu (TW); You-Hsien Chang, Hsinchu (TW); Hao-Min Ku, Hsinchu (TW); Ching-Yuan Tsai, Hsinchu (TW); Kuan-Chih Kuo, Hsinchu (TW); Chih-Hung Hsiao, Hsinchu (TW); Rong-Ren Lee, Hsinchu (TW)

(73) Assignee: EPISTAR CORPORATION, Hsinchu (TW)

(*) Notice: Subject to any disclaimer, the term of this patent is extended or adjusted under 35 U.S.C. 154(b) by 16 days.

(21) Appl. No.: 16/043,981

(22) Filed: Jul. 24, 2018

(65) Prior Publication Data
US 2018/0374992 A1   Dec. 27, 2018

Related U.S. Application Data

(63) Continuation of application No. 15/699,658, filed on Sep. 8, 2017, now Pat. No. 10,038,117, which is a (Continued)

(30) Foreign Application Priority Data

Jan. 16, 2015 (TW) .............................. 104101418 A

(51) Int. Cl.
*H01L 33/22* (2010.01)
*H01L 33/38* (2010.01)
(Continued)

(52) U.S. Cl.
CPC .............. *H01L 33/22* (2013.01); *H01L 33/02* (2013.01); *H01L 33/10* (2013.01); *H01L 33/24* (2013.01);
(Continued)

(58) Field of Classification Search
CPC ......... H01L 33/20; H01L 33/24; H01L 33/26; H01L 33/38
See application file for complete search history.

(56) References Cited

U.S. PATENT DOCUMENTS 8,774,246 B1    7/2014 Deppe et al.
10,181,582 B2 * 1/2019 Matsusue ............ H01L 51/5092
(Continued)

FOREIGN PATENT DOCUMENTS

CN    103155181 A    6/2013
JP    H11027459 A    1/1999
(Continued)

*Primary Examiner* — Ngan V Ngo
(74) *Attorney, Agent, or Firm* — Patterson + Sheridan, LLP

(57) ABSTRACT

A semiconductor light-emitting device comprises an epitaxial structure comprising an main light-extraction surface, a lower surface opposite to the main light-extraction surface, a side surface connecting the main light-extraction surface and the lower surface, a first portion and a second portion between the main light-extraction surface and the first portion, wherein a concentration of a doping material in the second portion is higher than that of the doping material in the first portion and, in a cross-sectional view, the second portion comprises a first width near the main light-extraction surface and second width near the lower surface, and the first width is smaller than the second width.

20 Claims, 9 Drawing Sheets

Related U.S. Application Data continuation of application No. 15/332,730, filed on Oct. 24, 2016, now Pat. No. 9,793,436, which is a continuation-in-part of application No. 14/996,744, filed on Jan. 15, 2016, now Pat. No. 9,490,394.

(51) Int. Cl.

| | | |
|---|---|---|
| H01L 33/02 | (2010.01) | |
| H01L 33/24 | (2010.01) | |
| H01L 33/10 | (2010.01) | |
| H01L 33/30 | (2010.01) | |
| H01L 33/26 | (2010.01) | |
| H01L 33/42 | (2010.01) | |
| H01L 33/14 | (2010.01) | |
| H01L 33/20 | (2010.01) | |
| H01L 33/40 | (2010.01) | |

(52) U.S. Cl.
CPC .............. *H01L 33/26* (2013.01); *H01L 33/30* (2013.01); *H01L 33/38* (2013.01); *H01L 33/025* (2013.01); *H01L 33/145* (2013.01); *H01L 33/20* (2013.01); *H01L 33/305* (2013.01); *H01L 33/405* (2013.01); *H01L 33/42* (2013.01)

(56) References Cited

U.S. PATENT DOCUMENTS

| | | | |
|---|---|---|---|
| 10,373,732 B2* | 8/2019 | Okamoto | |
| 2009/0160026 A1* | 6/2009 | Suzuki | C30B 25/02 257/615 |
| 2011/0045732 A1* | 2/2011 | Suzuki | H01L 51/5246 445/25 |
| 2011/0215352 A1 | 9/2011 | Jeong et al. | |
| 2011/0223360 A1* | 9/2011 | Shibuya | C03C 8/04 428/34 |
| 2012/0073727 A1* | 3/2012 | Matsumoto | H01J 9/261 156/109 |
| 2013/0155690 A1 | 6/2013 | Chen et al. | |
| 2013/0285095 A1 | 10/2013 | Moon | |
| 2014/0203317 A1 | 7/2014 | Shin et al. | |
| 2014/0301085 A1 | 10/2014 | Hwang et al. | |
| 2015/0060924 A1 | 3/2015 | Lin et al. | |
| 2015/0204508 A1 | 7/2015 | Kim et al. | |
| 2015/0349220 A1 | 12/2015 | Moon et al. | |
| 2016/0025900 A1* | 1/2016 | Suzuki | B32B 23/20 257/40 |
| 2016/0091431 A1 | 3/2016 | Clark | |
| 2016/0099388 A1 | 4/2016 | Jung et al. | |
| 2016/0211325 A1 | 7/2016 | Mori | |
| 2016/0211412 A1* | 7/2016 | Chiu | H01L 33/505 |
| 2016/0240731 A1 | 8/2016 | Peng et al. | |
| 2017/0331002 A1 | 11/2017 | Huang et al. | |

FOREIGN PATENT DOCUMENTS

| | | |
|---|---|---|
| JP | 2001135853 A | 5/2001 |
| JP | 2005026688 A | 1/2005 |
| JP | 2005150645 A | 6/2005 |
| JP | 2013110374 A | 6/2013 |
| KR | 20100077910 A | 7/2010 |

\* cited by examiner

US 10,566,498 B2

SEMICONDUCTOR LIGHT-EMITTING DEVICE

RELATED APPLICATION DATA

This application is a continuation application of U.S. patent application Ser. No. 15/699,658, filed Sep. 8, 2017, which is a continuation of U.S. patent application Ser. No. 15/332,730, filed Oct. 24, 2016, which is a continuation-in-part application of U.S. patent application Ser. No. 14/996,744, filed Jan. 15, 2016, which claimed the right of priority of TW Application No. 104101418, filed on Jan. 16, 2015, and the content of which is hereby incorporated by reference in its entirety.

TECHNICAL FIELD

This present application is related to a structure of light-emitting device.

DESCRIPTION OF BACKGROUND ART

FIG. 1 shows a structure of a conventional light-emitting diode 100 by accordance with prior art. The conventional light-emitting diode 100 comprising a substrate 5b, an epitaxial structure 1b and two electrodes 2, 9b, wherein the epitaxial structure 1b comprises a first semiconductor stack 11b, an active layer 10b and a second semiconductor stack 12b. The electrode 2 is formed on an upper surface of the epitaxial structure 1b for connecting the outer power supply through a metal conductive wire 2b, and the electrode 9b is formed under the substrate 5b. The electrodes 2, 9b are used for conducting an external electrical current flowing through the active layer 10b so that electrical holes and electrons recombine in the active layer 10b to release light with a peak wavelength, which makes the light-emitting diode 100 emit light. When the volume of the light-emitting diode 100 is decreased, the influence of the non-radiative recombination which comes from the lattice dislocations on the side wall of the epitaxial structure caused by etching becomes more obvious, and thus the light-emitting efficiency is decreased.

SUMMARY OF THE DISCLOSURE

A semiconductor light-emitting device comprises an epitaxial structure comprising an main light-extraction surface, a lower surface opposite to the main light-extraction surface, a side surface connecting the main light-extraction surface and the lower surface, a first portion and a second portion between the main light-extraction surface and the first portion, wherein a concentration of a doping material in the second portion is higher than that of the doping material in the first portion and, in a cross-sectional view, the second portion comprises a first width near the main light-extraction surface and second width near the lower surface, and the first width is smaller than the second width.

DETAILED DESCRIPTION OF PREFERRED EMBODIMENTS

First Embodiment

Figure 1:
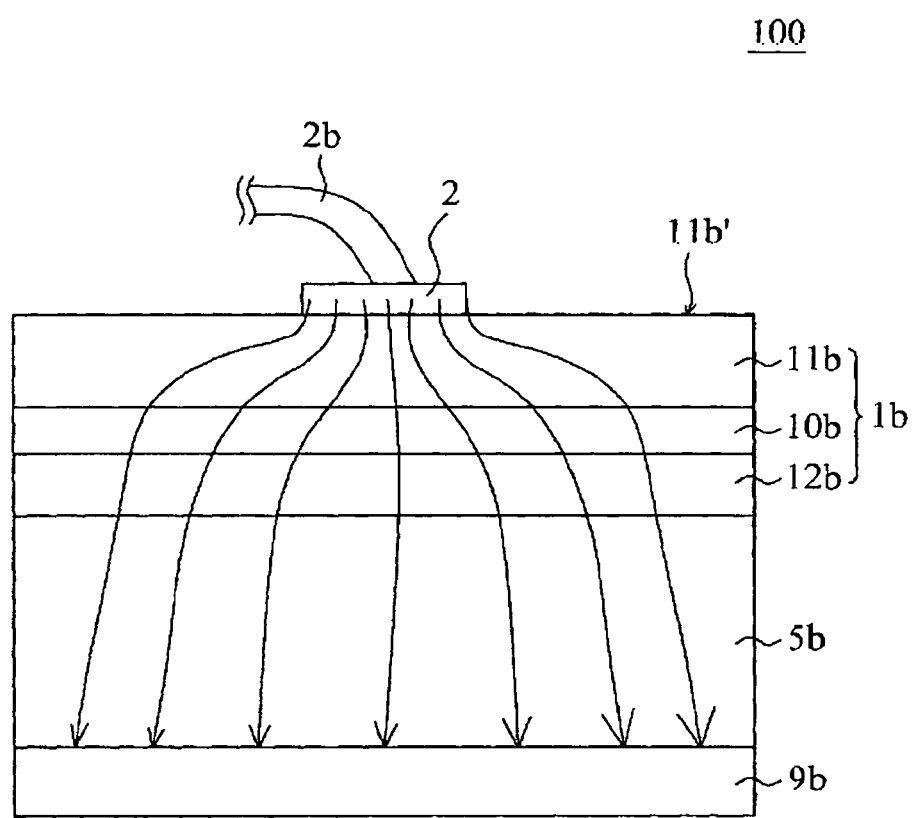
FIG. 1 shows a structure of a conventional light-emitting diode by accordance with prior art.
Figure 2A:
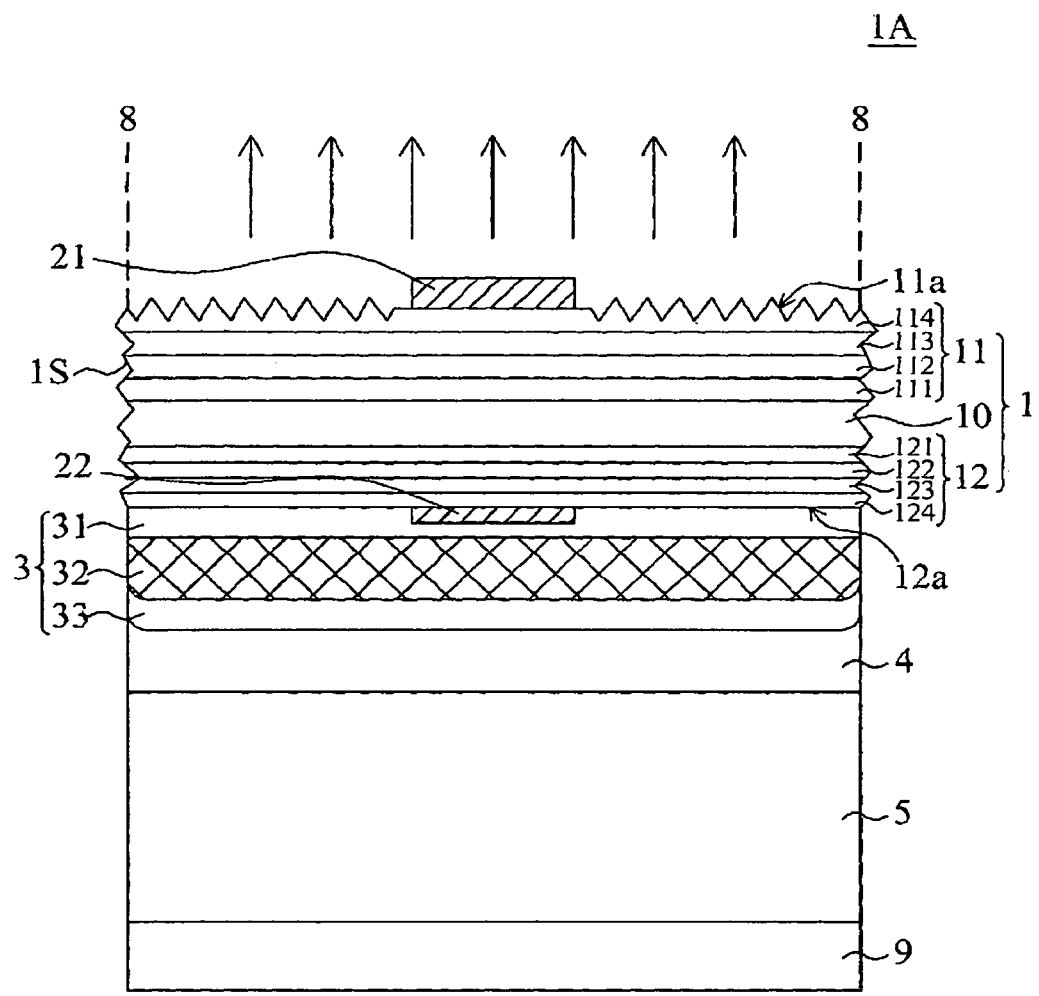
FIGS. 2A and 2B show a light-emitting device 1A disclosed in the first embodiment of the present application.

FIG. 2A shows a light-emitting device 1A in accordance with the first embodiment of the present application. The light-emitting device 1A comprises an epitaxial structure 1, wherein the epitaxial structure 1 comprises a first semiconductor stack 11, an active layer 10 and a second semiconductor stack 12. An upper electrode 21 is on the center position of an upper surface 11a of the first semiconductor stack 11 and ohmically contacts the first semiconductor stack 11, wherein a portion of the upper surface 11a of the first semiconductor stack 11 uncovered by the upper electrode 21 is a rough surface for improving the light extraction efficiency. In the embodiment, the upper surface 11a is the main light-extraction surface, and the epitaxial structure 1 is devoid of a distributed Bragg reflector (DBR) between the active layer 10 and the upper surface 11a. A second ohmic contact structure 22 is on the center position of a lower surface 12a of the second semiconductor stack 12 and ohmically contacts the second semiconductor stack 12; a reflective stack 3 is on the lower surface 12a of the second semiconductor stack 12 for covering the second semiconductor stack 12 and the second ohmic contact structure 22, wherein the reflective stack 3 comprises a transparent conductive layer 31 covering the second semiconductor stack 12 and the second ohmic contact structure 22, a metal reflective layer 32 covering the transparent conductive layer 31, and a barrier layer 33 covering the metal reflective layer 32; a conductive substrate 5 bonded with the reflective stack 3 by an adhesive layer 4; and a back side electrode 9 disposed on a side of the conductive substrate 5 opposite to the reflective stack 3, wherein an electrical current is conducted into the light-emitting device 1A by the upper electrode 21 and the back side electrode 9 so that the active layer 10 emits a light which is able to penetrate the first semiconductor stack 11 and the second semiconductor stack 12. The bandgaps of the first semiconductor stack 11 and the second semiconductor stack 12 are larger than the bandgap of the active layer 10, so the transparencies of the first semiconductor stack 11 and the second semiconductor stack 12 for the light emitted from the active layer 10 are more than 50%. The light is able to penetrate the first semiconductor stack 11 and exit from the upper surface 11a or a side surface 1S of the epitaxial structure 1, or is able to be reflected by the reflective stack 3 and exit from the upper surface 11a or the side surface 1S of the epitaxial structure 1.

The active layer 10 comprises a MQW (Multiple Quantum Wells) structure; the first semiconductor stack 11 comprises a first conductivity confining layer 111, a first conductivity cladding layer 112, a first conductivity window layer 113, and a first conductivity contact layer 114; the second semiconductor stack 12 comprises a second conductivity confining layer 121, a second conductivity cladding layer 122, a second conductivity window layer 123, and a second conductivity contact layer 124. The first conductivity cladding layer 112 and the second conductivity cladding layers 122 respectively provides electrons and holes recombining in the active layer 10 for emitting a light, and both layers have bandgaps larger than the bandgap of the active layer 10. The first conductivity confining layer 111 and the second conductivity confining layer 121 are able to increase the percentage of the electrons and the holes recombining in the active layer 10 and both have bandgaps larger than the bandgap of the active layer 10. The first conductivity window layer 113 and the second conductivity window layer 123 both have smaller sheet resistance than that of both of the cladding layers 112, 122 for improving the electrical current lateral spreading and increasing the light extraction efficiency. The first conductivity contact layer 114 and the second conductivity contact layer 124 ohmically contact the upper electrode 21 and the second ohmic contact structure 22 respectively, wherein the resistance between the first conductivity contact layer 114 and the upper electrode 21 and the resistance between the second conductivity contact layer 124 and the second ohmic contact structure 22 are smaller than $10^{-4}$ Ω-cm. The material of the first semiconductor stack 11, the active layer 10 and the second semiconductor stack 12 comprises III-V semiconductor, such as $Al_xIn_yGa_{(1-x-y)}N$ or $Al_xIn_yGa_{(1-x-y)}P$, $0 \le x$, $y \le 1$, and can be doped different elements to be with different conductivities. For example, the first conductivity is n-type and the second conductivity is p-type, or the first semiconductor stack 11 is a n-type semiconductor and the second semiconductor stack 12 is p-type semiconductor. The epitaxial structure 1 is able to emit red light with a peak wavelength between 610 nm and 650 nm, green light with a peak wavelength between 530 nm and 570 nm or blue light with a peak wavelength between 440 nm and 490 nm depending on the material of the active layer 10.

Figure 3:
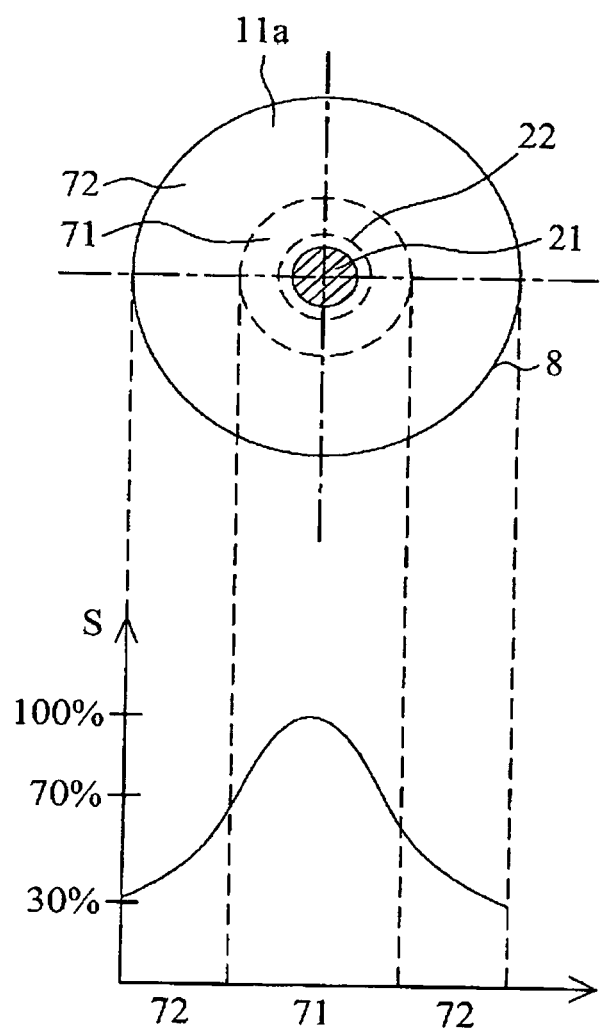
FIG. 3 shows the top-view of the light-emitting device 1A disclosed in the first embodiment of the present application.

FIG. 3 shows the top-view of the light-emitting device 1A in accordance with this embodiment of the present application. The light-emitting device 1A has an edge 8 for defining the shape of the upper surface 11a. In the embodiment, the upper surface 11a is a circle, and in other embodiment, the upper surface 11a comprises a polygon, such as rectangle, inequilateral pentagon and inequilateral hexagon, or a regular polygon, such as square, equilateral pentagon and equilateral hexagon. The upper electrode 21 and the second ohmic contact structure 22 are respectively on the center of the upper surface 11a and the center of the lower surface 12a for decreasing the proportion of the electrical current flowing through the side wall 1S of the epitaxial structure 1. In the embodiment, the area of the upper electrode 21 is 1%~10% of the area of the upper surface 11a of the first semiconductor stack 11 and the area of the second ohmic contact structure 22 is 1%~10% of the area of the lower surface 12a of the second semiconductor stack 12 for preventing the upper electrode 21 and the second ohmic contact structure 22 from shielding too much light as the area of the upper electrode 21 and the area of the second ohmic contact structure 22 being too large, and for preventing the forward threshold voltage from being too high that might decrease the light-emitting efficiency as the area of the upper electrode 21 becomes too small. As the area of the upper electrode 21 is about 2% of the area of the upper surface 11a and the area of the second ohmic contact structure 22 is about 2% of the area of the lower surface 12a, the light-emitting efficiency is the highest.

In the embodiment, the area of the upper surface 11a of the light-emitting device 1A is smaller than 10000 μm², or the circumference of the upper surface 11a is smaller than 400 μm. The upper electrode 21 is on the center of the upper surface 11a and the smallest distance between the upper electrode 21 and the edge 8 is smaller than 50 μm. As the thickness of the epitaxial structure 1 is larger than 10 μm and the ratio of the thickness of the epitaxial structure 1 to the circumference of the upper surface 11a is larger than 2.5%, the electrical current easily spreads in the epitaxial structure 1, and the ratio of the electrical current flowing through the side surface 1S of the epitaxial structure 1 of the light-emitting device 1A is increased. Therefore, in the embodiment, the thickness of the epitaxial structure 1 is decreased to be smaller than 3 μm, between 1 μm and 3 μm, or preferably between 1 μm and 2 μm, and the ratio of the thickness of the epitaxial structure 1 to the circumference of the upper surface 11a is smaller than 0.75% for reducing the non-radiative recombination and increasing the light-emitting efficiency. The total thickness of the first semiconductor stack 11 is the thickness of the epitaxial structure between the active layer 10 and the upper surface 11a, and the total thickness of the second semiconductor stack 12 is the thickness of the epitaxial structure between the active layer 10 and the lower surface 12a. In the embodiment, the total thickness of the first semiconductor stack 11 is not larger than 1 μm, or preferably between 1000 Å and 5000 Å, and/or the total thickness of the second semiconductor stack 12 is not larger than 1 μm, or preferably between 1000 Å and 5000 Å, wherein the thickness of each of the first conductivity confining layer 111, the first conductivity cladding layer 112 and the first conductivity window layer 113 of the second semiconductor stack 12 is not larger than 2000 Å, or preferably between 500 Å and 1500 Å; the thickness of each of the second conductivity confining layer 121, the second conductivity cladding layers 122, and the second conductivity window layer 123 is not larger than 2000 Å, or preferably between 500 Å and 1500 Å. The thickness of each of the first conductivity contact layer 114 and the second conductivity contact layer 124 is not larger than 2000 Å, or preferably between 500 Å and 1500 Å. Since the total thickness of the first semiconductor stack 11 is between 1000 Å and 5000 Å, the upper surface 11a of the first semiconductor stack 11 is roughened by wet etching or dry etching method. In order to precisely control the etching depth, the upper surface 11a of the first semiconductor stack 11 can be etched by ICP (Inductively Coupled Plasma) for preventing the first semiconductor stack 11 from being penetrated to form current leakage paths due to poor control of the etching depth. On the roughened upper surface 11a of the first semiconductor stack 11, the distance between a high point and a neighboring low point in vertical direction is between 500 Å and 3000 Å.

In the embodiment, the shape of the upper surface 11a of the light-emitting device 1A is preferably a circle, and the side surface 1S of the epitaxial structure 1 is formed by ICP, so the side surface 1S is a rough or an uneven surface, the portion of the electrical current flowing through the side surface 1S is increased, the non-radiative recombination is increased, and the light-emitting efficiency is decreased. In order to decrease the area of the side surface 1S of the epitaxial structure 1 for reducing the non-radiative recombination thereon, the shape of the upper surface 11a is a circle. When the area of the upper surface 11a of the light-emitting device 1A is 10000 μm², the circumference of the upper surface 11a is about 354 μm as the shape of the upper surface 11a is a circle, which is smaller than 400 μm of the circumference of the upper surface 11a as the shape of the upper surface 11a is a square. As the circumference is smaller, the area of the side surface 1S of the epitaxial structure 1 is smaller. As the shape of the upper surface 11a is a circle, the distance between each of points of the edge 8 and the upper electrode 21 on the center thereof is the same for limiting the electrical current flowing paths in the interior of the epitaxial structure 1.

FIG. 3 shows the upper surface 11a of the light-emitting device 1A comprising a first light-extraction region 71 and a second light-extraction region 72, wherein the first light-extraction region 71 is on the center of the upper surface 11a, and the second light-extraction region 72 is between the first light-extraction region 71 and the edge 8. When the light-emitting device 1A is applied to a pixel of a display and driven by a smaller electrical current density, such as an electrical current density between 0.1 A/cm$^2$ and 1 A/cm$^2$, the upper surface 11a has a near-field luminous intensity distribution S, wherein the maximum near-field luminous intensity is in the first light-extraction region 71, the near-field luminous intensity in the first light-extraction region 71 is larger than 70% of the maximum near-field luminous intensity, and the near-field luminous intensity in the second light-extraction region 72 is between 30% and 70% of the maximum near-field luminous intensity. In the embodiment, the total of the thickness of the epitaxial structure 1 is significantly reduced so the distance of the electrical current flowing through the epitaxial structure 1 in vertical direction is decreased, and the electrical current is able to be limited in the interior of the epitaxial structure 1 with difficulty to diffuse to the side of the epitaxial structure 1. The upper electrode 21 and the second ohmic contact structure 22 are respectively on the center of the upper surface 11a and the center of the lower surface 12a so the portion of the electrical current flowing to the side surface 1S of the epitaxial structure 1 is decreased so the loss of the light emitting efficiency caused by the non-radiative recombination is reduced. The shape of the first light-extraction region 71 is a circle, which is similar to the shape of the upper surface 11a, and the area ratio of the first light-extraction region 71 to the second light-extraction region 72 is between 0.25 and 0.45.

Figure 2B:
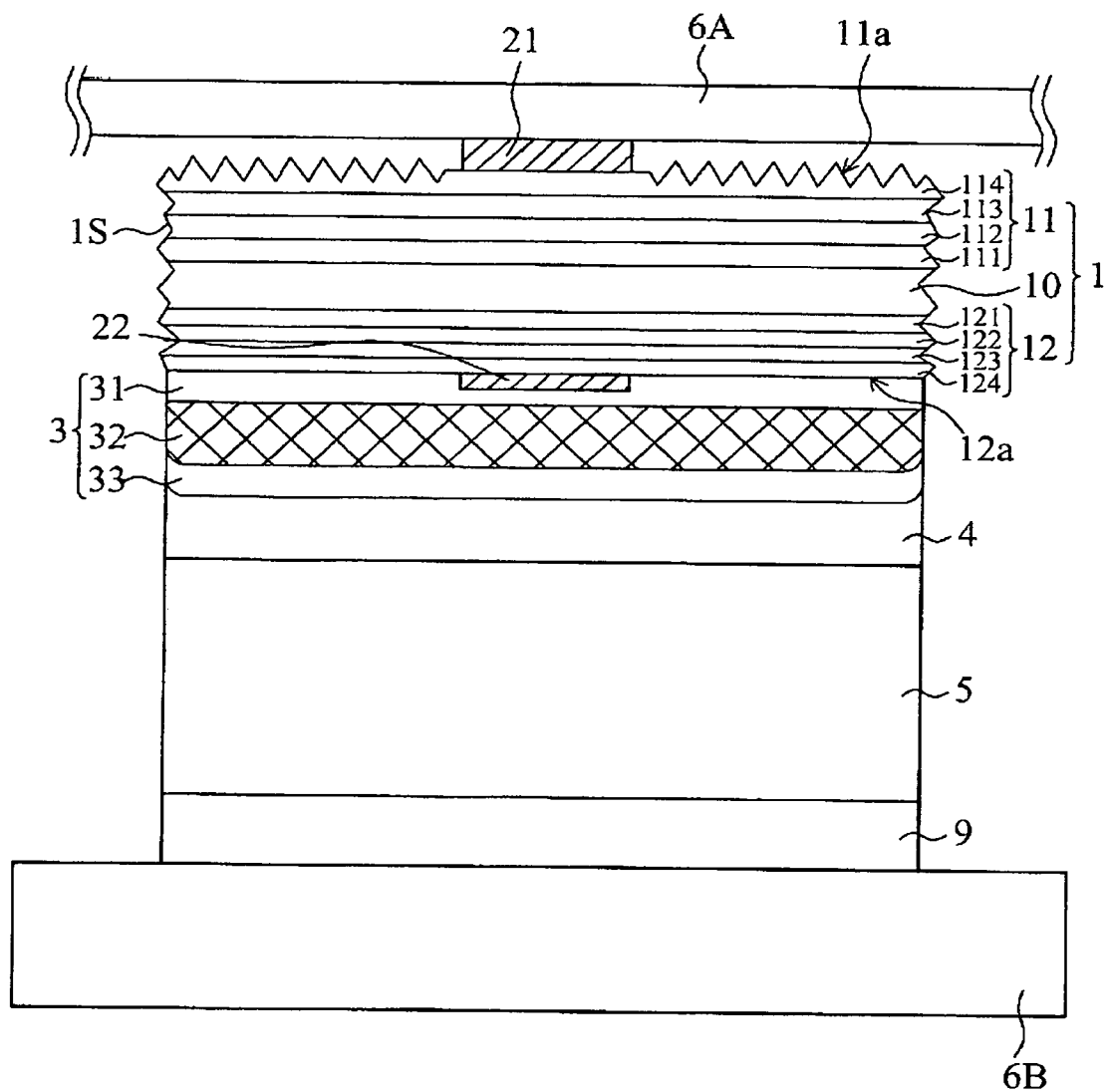

In the embodiment, the area of the upper surface 11a of the light-emitting device 1A is smaller than 10000 μm$^2$. When the shape of the upper surface 11a is square, the circumference of the upper surface 11a is smaller than 400 μm. When the shape of the upper surface 11a is circle, the circumference of the upper surface 11a is smaller than 354 μm. When the upper electrode 21 is connected to a metal line with a width between 5 μm and 10 μm on the upper surface 11a for conducting an external electrical current, the portion of area of the upper surface 11a shielded by the metal line is over 2.5% of the area of the upper surface 11a so the light-extraction area is decreased. Thus, as shown in FIG. 2B, the light-emitting device 1A is able to be bonded to a circuit of a sub-mount 6B, such as lead frame, for forming an electrical connection, and an external transparent electrode 6A is provided to connect the upper electrode 21 of the light-emitting device 1A for conducting the external electrical current, wherein the material of the transparent electrode 6A comprises conductive oxide, such as IZO, IGZO, ZnO and AZO. In other embodiment, multiple light-emitting devices 1A are electrically connected to the circuit of the sub-mount 6B, and the transparent electrode 6A connects the upper electrodes 21 of the multiple light-emitting devices 1A to form a parallel, series or series-parallel circuit. In the embodiment, the first semiconductor stack 11 is n-type semiconductor, and the transparent electrode 6A ohmically contacts the upper electrode 21. The material of the upper electrode 21 comprises metal, such as Ge, Au, Ni, Ge—Au alloy and Ge—Au—Ni alloy. The second ohmic contact structure 22 is on the center position of the lower surface 12a opposite to the upper surface 11a and ohmically contacts the second semiconductor stack 12, wherein the concentration of the doped material of the second conductivity contact layer 124 of the second semiconductor stack 12 is about $1*10^{19}/cm^3$. The second ohmic contact structure 22 can be made of metal oxide, such as ITO, for ohmically contacting the second semiconductor stack 12 and increasing the light extraction efficiency from the lower surface 12a of the second semiconductor stack 12. The material of the transparent conductive layer 31 on the second ohmic contact structure 22 comprises IZO, IGZO, ZnO, or AZO. The material of the metal reflective layer 32 on the transparent conductive layer 31 comprises the metal having the reflective index larger than 95% to the light emitted from the active layer 10, such as Ag, Al and Au. The transparent conductive layer 31 is able to separate the metal reflective layer 32 and the second semiconductor stack 12 to prevent physical or chemical reaction from occurring between the metal reflective layer 32 and the second semiconductor stack 12 that might decrease the reflective index or electrical conductivity of the metal reflective layer 32 as the light-emitting device 1A is driven by an electrical current for a long period. Besides, the transparent conductive layer 31 is able to laterally spread the electrical current in the reflective stack 3 to prevent the heat from concentrating in a portion of the reflective stack 3. The refractive index of the transparent conductive layer 31 is 1.0 smaller than the refractive index of the second semiconductor stack 12 so the total reflection interface caused by the difference of the refractive indices therebetween is able to reflect a portion of the light emitted from the active layer 10, and the rest of the light, which is not reflected, penetrates the transparent conductive layer 31 and is reflected by the metal reflective layer 32. The material of the barrier layer 33 covering the metal reflective layer 32 comprises Ti, Pt, Au, W, Cr or the alloy thereof for separating the metal reflective layer 32 and the adhesive layer 4 for maintaining the stability of the metal reflective layer 32 and for preventing physical or chemical reaction from occurring between the metal reflective layer 32 and the adhesive layer 4 that decreases the reflective index or electrical conductivity thereof. The adhesive layer 4 is used for bonding the conductive substrate 5 and the reflective stack 3 so the electrical current is able to flow therebetween. The material of adhesive layer 4 comprises In, Ti, Ni, Sn, Au, the stack thereof or the alloy thereof. The material of conductive substrate 5 comprises Si, GaAs, CuW, Cu or Mo. The back side electrode 9 disposed on a side of the conductive substrate 5 opposite to the reflective stack 3 comprises Au for conducting the external electrical current. In the embodiment, when the external electrical current is conducted to the light-emitting device 1A, an electrical current density passing through the epitaxial structure 1 is between 0.1 A/cm$^2$ and 1 A/cm$^2$.

Second Embodiment

Figure 4A:
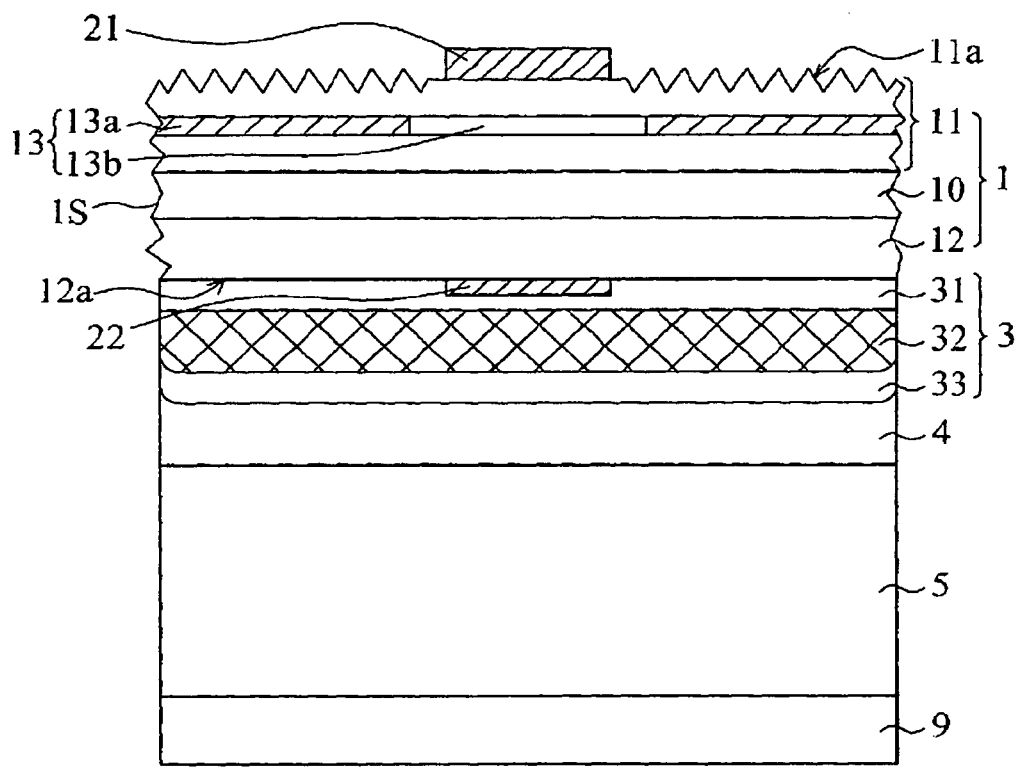
FIGS. 4A and 4B show a light-emitting device 1B and a light-emitting device 1C disclosed in the second embodiment of the present application.
Figure 4B:
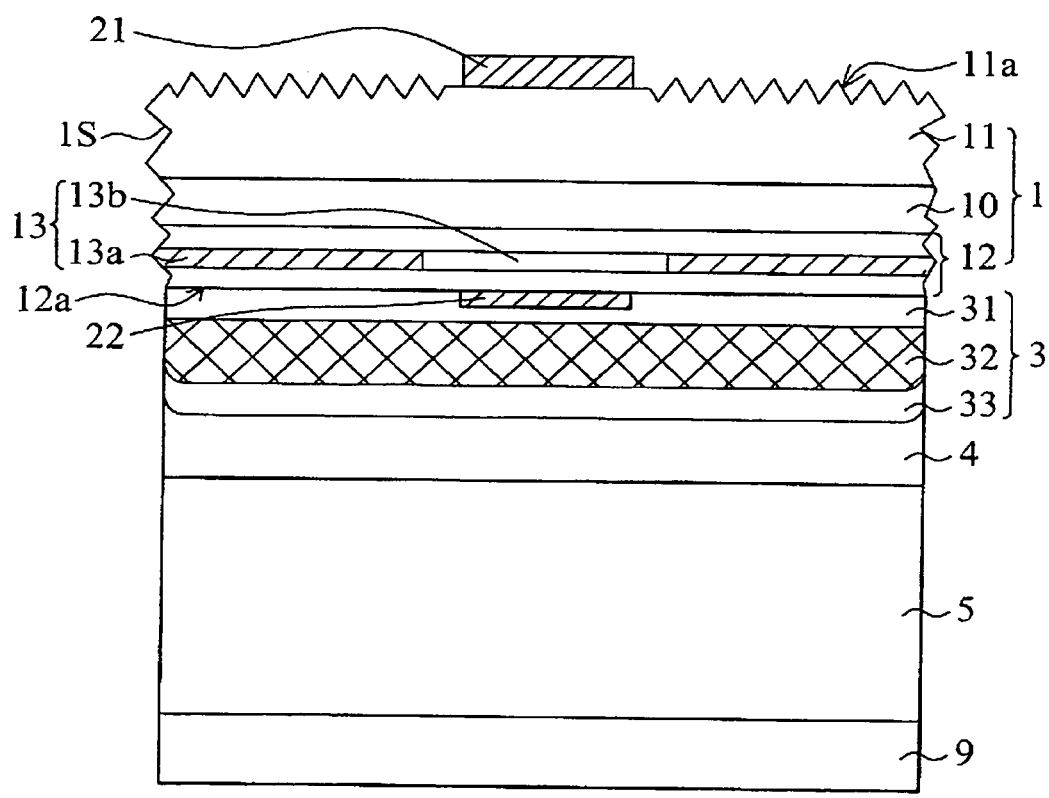
Figure 4C:
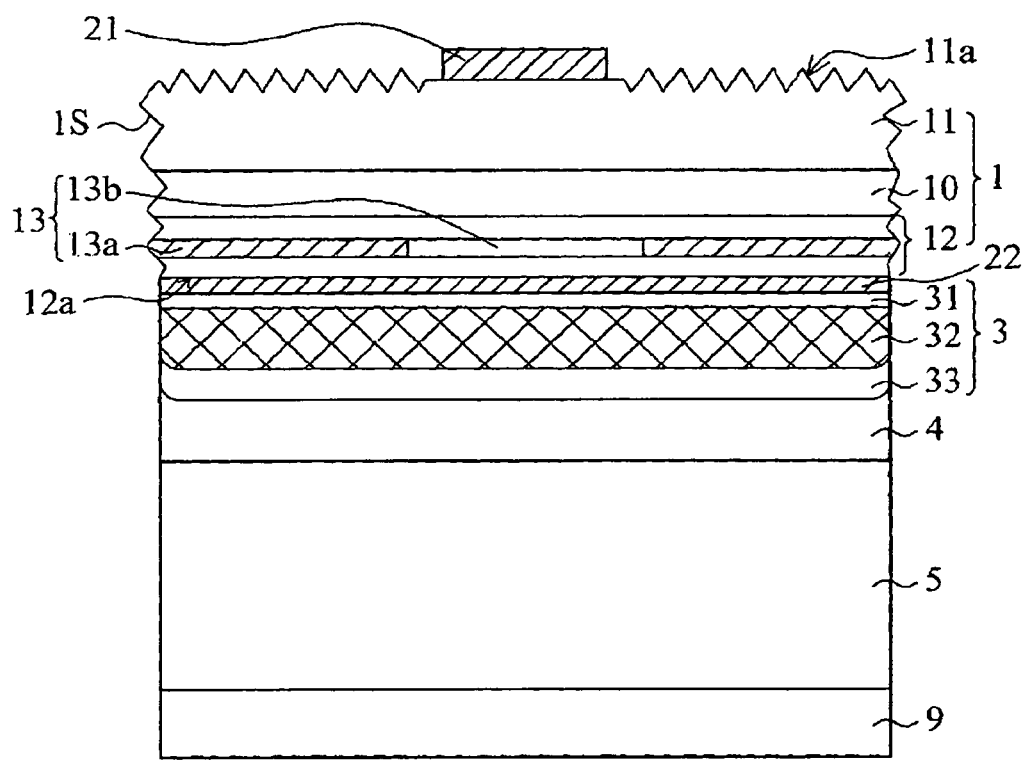
FIG. 4C shows a light-emitting device 1D disclosed in one embodiment of the present application.

FIGS. 4A and 4B show a light-emitting device 1B and a light-emitting device 1C in accordance with the second embodiment of the present application. The difference between the second embodiment and the first embodiment is that the epitaxial structure 1 comprises a control layer 13, wherein the control layer 13 is in the first semiconductor stack 11 as FIG. 4A shows the light-emitting device 1B, or the control layer 13 is in the second semiconductor stack 12 as FIG. 4B shows the light-emitting device 1C. The control layer 13 comprises a conductive region 13b and an oxide region 13a, wherein the oxide region 13a surrounds the conductive region 13b and exposes on the side surface 1S of the epitaxial structure 1. The material of the conductive region 13b comprises conductive material, such as (Al$_x$Ga$_{1-x}$)As, 0.9<x≤1. The material of the oxide region 13a comprises electrically-insulative material, such as Al$_y$O, 0<y<1. The conductive region 13b, the upper electrode 21, and the second ohmic contact structure 22 are overlapped in the vertical direction to limit the electrical current to be distributed in a portion of the epitaxial structure 1. FIG. 4C shows a light-emitting device 1D in accordance with one embodiment of the present embodiment. The second ohmic contact structure 22 covers the lower surface 12a of the second semiconductor stack 12. The transparent conductive layer 31 covers the second ohmic contact structure 22, wherein the transparent conductive layer 31 is able to laterally distribute electrical current and to bind the second ohmic contact structure 22 with the metal reflective layer 32. In the embodiment, the materials of the second ohmic contact structure 22, the transparent conductive layer 31, and the metal reflective layer 32 are the same as the materials mentioned in the first embodiment.

Third Embodiment

Figure 5A:
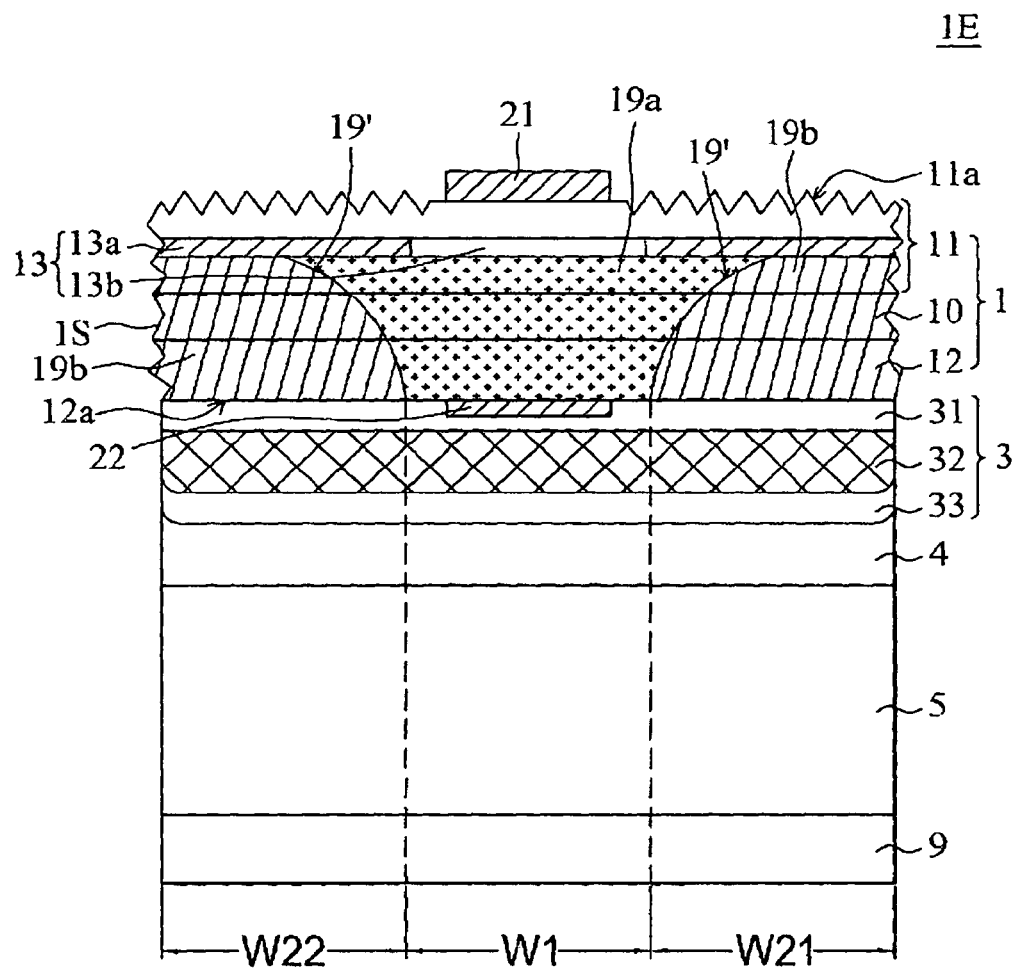
FIGS. 5A and 5B show a light-emitting device 1E and a light-emitting device 1F disclosed in the third embodiment of the present application.

FIG. 5A shows a cross-sectional view of a light-emitting device 1E in accordance with the third embodiment of the present application. The difference between the light-emitting device 1E and the light-emitting device 1B in accordance with the second embodiment shown in FIG. 4A is that the epitaxial structure 1 comprises a first portion 19a and a second portion 19b between the edge 8 and surrounding the first portion 19a, wherein the first portion 19a and the second portion 19b are both between the control layer 13 and the lower surface 12a. The second portion 19b surrounds the first portion 19a, and contacts the reflective stack 3 and the control layer 13. In a vertical direction, the first portion 19a and the upper electrode 21 are overlapped, and the second portion 19b and the upper electrode 21 are not overlapped. Thus, as shown in FIF. 5A, from the cross-sectional view, the first portion 19a has a width w1 and the second portion 19b has two widths w21, w22, wherein w1/(w21+w22) is preferably between about 0.01 and 100 and the two widths w21, w22 can be equal or different. In one embodiment, a top-view of the light-emitting device 1E may be the same as or similar to the top-view of the light-emitting device 1A as shown in FIG. 3, wherein the first portion 19a and the second portion 19b may respectively correspond to the first light-extraction region 71 and the second light-extraction region 72.

According to the third embodiment, in the second portion 19b, the first semiconductor stack 11, the active layer 10 and the second semiconductor stack 12 is further doped with doping material, such as Zn, Te or Sb, which is not doped or less doped in the first portion 19a, to make the electric resistance of the second portion 19b be higher than that of the first portion 19a. Thus, the electrical current is able to be limited to only flow through the first portion 19a. In one example, the doping material is doped into the epitaxial structure 1 from the lower surface 12a, wherein the doping material diffuses from the second semiconductor stack 12 to the first semiconductor stack 11. Further, in the example, the control layer 13 has the Al concentration higher than 60% to be able to block the doping material. As shown in FIG. 5A, a boundary 19' between the first portion 19a and the second portion 19b is a curve, and the concentration of the doping material in the second portion 19b decreases from the lower surface 12a to the control layer 13. In the second portion 19b, the concentration of the doping material in the second semiconductor stack 12 is over $1*10^{18}/cm^3$, preferably between about $1*10^{18}/cm^3$ and $5*10^{18}/cm^3$, and that in the first semiconductor stack 11 is lower than $1*10^{18}/cm^3$, preferably lower than $1*10^{17}/cm^3$. Thus, in the second portion 19b, the electric resistance decreases from the lower surface 12a to the control layer 13. As shown in FIG. 5A, the control layer 13 of the light-emitting device 1E is the same as or similar to the control layer 13 of the light-emitting device 1B shown in FIG. 4A, wherein the control layer 13 comprises the conductive region 13b and the oxide region 13a as described in the foregoing embodiments.

Figure 5B:
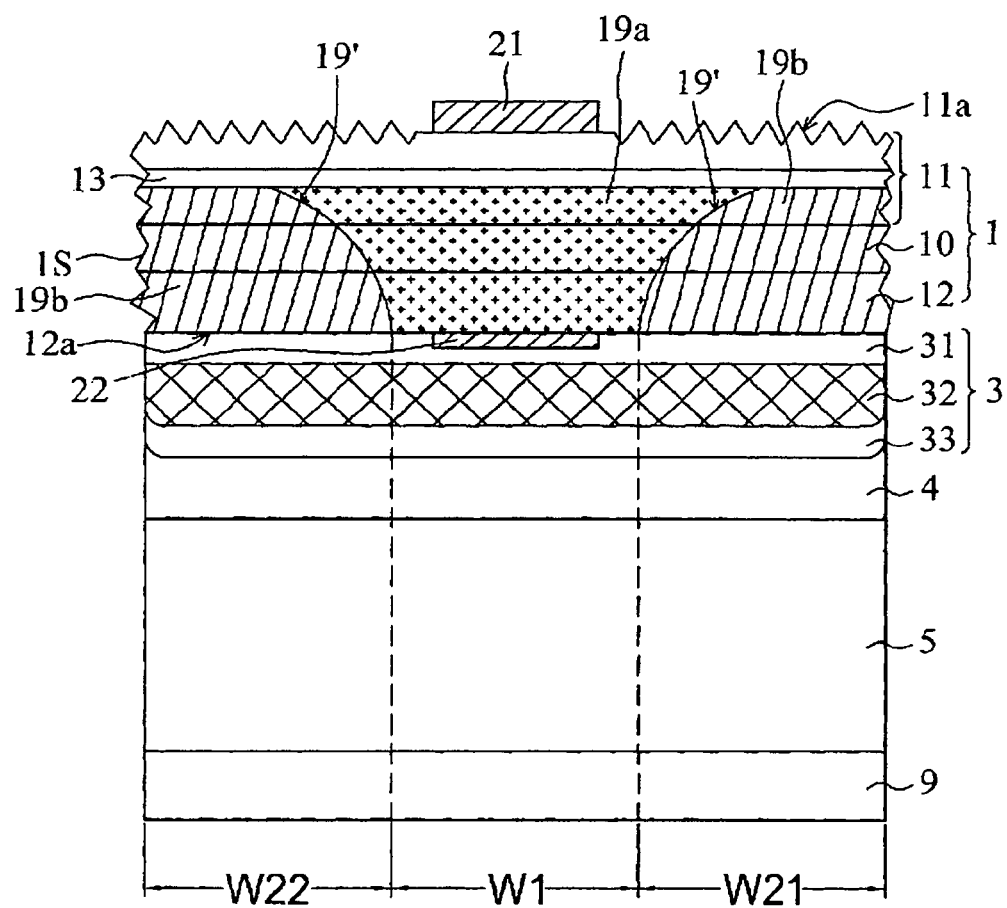

FIG. 5B shows cross-sectional view of a light-emitting device 1F in accordance with one embodiment. The difference between the light-emitting device 1F and the light-emitting device 1E is that the control layer 13 of the light-emitting device 1F is a monolithic layer and the material of the control layer 13 comprises conductive material, such as (Al$_x$Ga$_{1-x}$)As, 0.6<x≤1.

In this embodiment, the ratio of the thickness of the epitaxial structure 1 to the circumference of the upper surface 11a can be between about 2% and 20% or between 5% and 10%, and the electrical current also can be limited to flow through the first portion 19a in the epitaxial structure 1 for reducing the non-radiative recombination and increasing the light-emitting efficiency.

Although the present application has been explained above, it is not the limitation of the range, the sequence in practice, the material in practice, or the method in practice. Any modification or decoration for present application is not detached from the spirit and the range of such.

What is claimed is:
1. A light-emitting device comprising:
   an epitaxial structure having a first thickness and an upper surface with a circumference, comprising:
      a first semiconductor stack;
      an active layer on the first semiconductor stack; and
      a second semiconductor stack on the active layer and having a second thickness not larger than 1 μm;
   wherein a ratio of the first thickness to the circumference is between 2% and 20%.
2. The light-emitting device according to claim 1, wherein an area of the upper surface is smaller than 10000 μm$^2$.
3. The light-emitting device according to claim 1, wherein the circumference is smaller than 400 μm.
4. The light-emitting device according to claim 1, wherein the epitaxial structure is devoid of a distributed Bragg reflector between the active layer and the upper surface.
5. The light-emitting device according to claim 1, wherein the upper surface has a square shape.
6. The light-emitting device according to claim 1, wherein the circumference is smaller than 354 μm.
7. The light-emitting device according to claim 1, wherein the second semiconductor stack comprises three semiconductor layers, one of which has a thickness less than 2000 Å.
8. The light-emitting device according to claim 1, wherein the first thickness is smaller than 3 μm.
9. The light-emitting device according to claim 1, wherein the active layer comprises a multiple quantum well structure.
10. The light-emitting device according to claim 1, wherein the first semiconductor stack, the active layer and the second semiconductor stack comprise an III-V semiconductor material.

11. The light-emitting device according to claim 1, wherein the first semiconductor stack is a p-type semiconductor and the second semiconductor stack is an n-type semiconductor.

12. The light-emitting device according to claim 1, further comprising a first electrode contacts the first semiconductor stack.

13. The light-emitting device according to claim 12, further comprising a second electrode contacts the second semiconductor stack.

14. The light-emitting device according to claim 1, wherein the light-emitting device has a current density between 0.1 A/cm$^2$ and 1 A/cm$^2$.

15. A light-emitting device comprising:

an epitaxial structure having a first thickness and an upper surface with a circumference, comprising:

a first semiconductor stack;

an active layer on the first semiconductor stack; and a second semiconductor stack on the active layer and having a second thickness not larger than 1 μm;

wherein a ratio of the first thickness to the circumference is smaller than 0.75%.

16. The light-emitting device according to claim 14, wherein an area of the upper surface is smaller than 10000 μm$^2$.

17. The light-emitting device according to claim 14, wherein the circumference is smaller than 400 μm.

18. The light-emitting device according to claim 14, wherein the upper surface has a square shape.

19. The light-emitting device according to claim 14, wherein the circumference is smaller than 354 μm.

20. The light-emitting device according to claim 14, wherein the first thickness is smaller than 3 μm.

* * * * *